(12) United States Patent
Dietrich (10) Patent No.: US 8,036,059 B2
(45) Date of Patent: Oct. 11, 2011

(54) SEMICONDUCTOR MEMORY CIRCUIT, CIRCUIT ARRANGEMENT AND METHOD FOR READING OUT DATA

(75) Inventor: Stefan Dietrich, Türkenfeld (DE)

(73) Assignee: Qimonda AG, Munich (DE)

( * ) Notice: Subject to any disclaimer, the term of this patent is extended or adjusted under 35 U.S.C. 154(b) by 1372 days.

(21) Appl. No.: 11/594,562

(22) Filed: Nov. 8, 2006

(65) Prior Publication Data

US 2007/0121393 A1    May 31, 2007

(30) Foreign Application Priority Data

Nov. 8, 2005    (DE) .......................... 10 2005 053 294

(51) Int. Cl.
*G11C 7/00* (2006.01)
(52) U.S. Cl. .................................. 365/221; 365/189.05
(58) Field of Classification Search .................. 365/221, 365/189.05
See application file for complete search history.

(56) References Cited

U.S. PATENT DOCUMENTS

| 6,493,794 | B1 | 12/2002 | Yamashita |
| 2003/0188064 | A1 | 10/2003 | Dietrich et al. |
| 2005/0286506 | A1* | 12/2005 | LaBerge ...................... 370/363 |

* cited by examiner

*Primary Examiner* — Michael Tran
(74) *Attorney, Agent, or Firm* — John S. Economou (57) ABSTRACT

A circuit arrangement for reading out data time delayed from a semiconductor memory comprises a common data input at which read data, which are read out of a semiconductor memory, are present and a data buffer FIFO for buffering the read data. The buffer FIFI comprises a plurality of FIFO modules each comprising a plurality of individual FIFO cells. Each FIFO module can be addressed via respective allocated first input and output pointers and each FIFO cell can be addressed via respective allocated second input and output pointers. The circuit arrangement further comprises a controllable read latency generator generating the first and second output pointers for driving the FIFO modules and FIFO cells with a read latency predetermined with reference to the first and second input pointers, respectively, and a common data output at which the read data are present time-delayed in dependence on the predetermined read latency.

16 Claims, 6 Drawing Sheets

SEMICONDUCTOR MEMORY CIRCUIT, CIRCUIT ARRANGEMENT AND METHOD FOR READING OUT DATA

BACKGROUND OF THE INVENTION

The invention relates to a circuit arrangement for time delaying read data read from a semiconductor memory with a predetermined read latency. The invention also relates to a semiconductor memory circuit and a method.

In modern computer and software applications, there is an increase in requirement for processing ever greater volumes of data in an ever shorter time. To store the data, highly integrated memories such as, e.g. synchronous dynamic random access memories (S-DRAM) are used. S-DRAMs are standard memory chips which consist of highly integrated transistors and capacitors and which allow a memory access without additional weight cycles. The data are transferred between the S-DRAM and an external data bus synchronously with an external clock signal.

Figure 1:
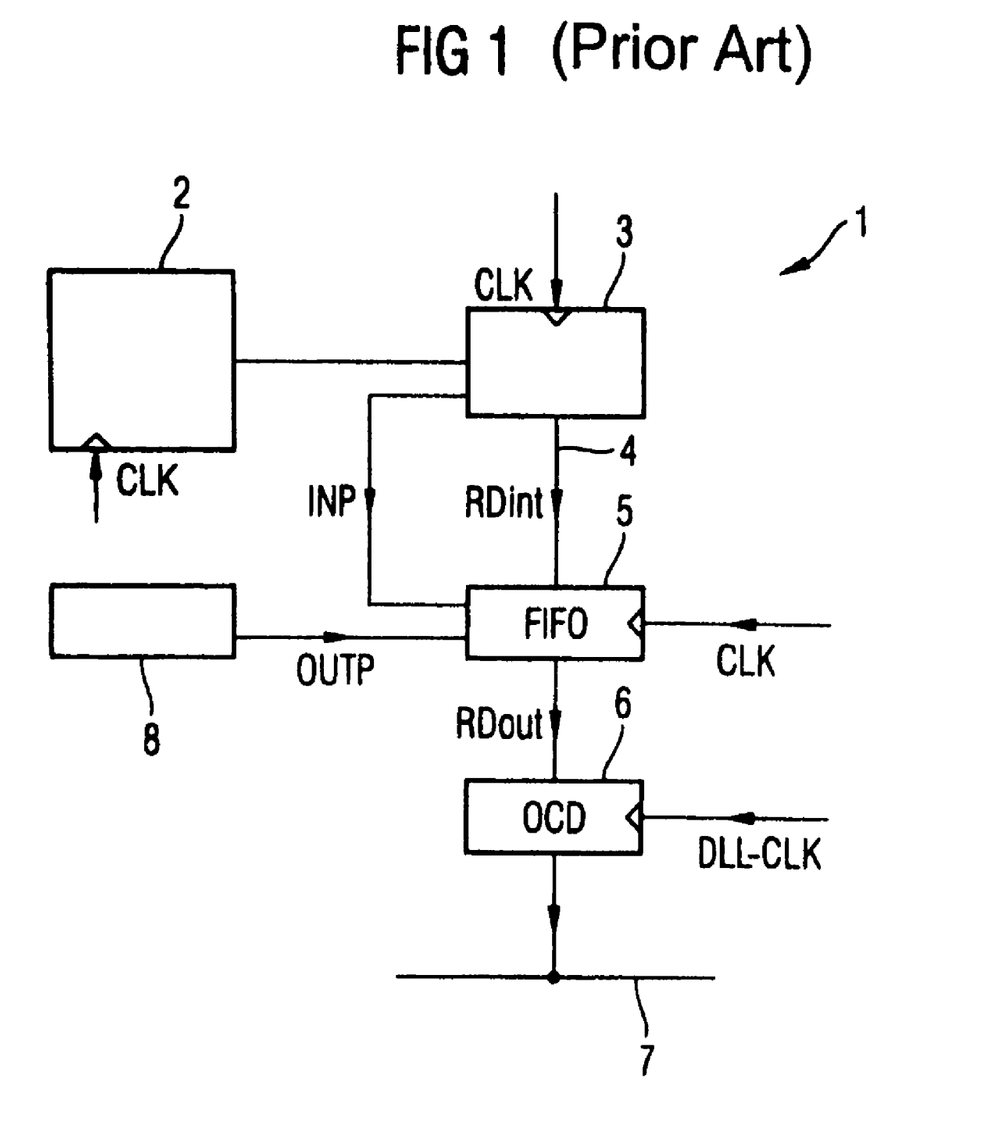
FIG. 1, as discussed above, is a block diagram with a section of a conventioned S-DRAM memory in the area of its read path.

FIG. 1 of the drawing shows a section of a part of a S-DRAM as disclosed in German Patent No. 102 10 726 B4 and there, in particular, in FIG. 1, only its read path being shown in FIG. 1. The S-DRAM 1 contains a memory cell array 2. Data are read out of the memory cell array 2 via a read amplifier 3 and an internal data bus 4 clocked via an internal clock signal CLK. For the synchronous data output, the read data path contains a data buffer FIFO 5. The read data temporarily stored in the data buffer FIFO 5 are read out of the data buffer FIFO 5 via an off-chip driver (OCD) 6 and supplied for further processing to other communication parties, for example a microcontroller, via an external data bus 7.

The data buffer FIFO 5 is driven by the read amplifier 3 via a read pointer INP and by a read latency generator 8 by means of an output pointer OUTP. The output pointer OUTP acts as time-delayed data release signal. For controlling, and thus for adjusting the read latency, the read latency generator 8 is connected at its input, via a decoder, not shown, to a mode register in which the latency information for the various operating modes of the S-DRAM are stored.

Figure 2:
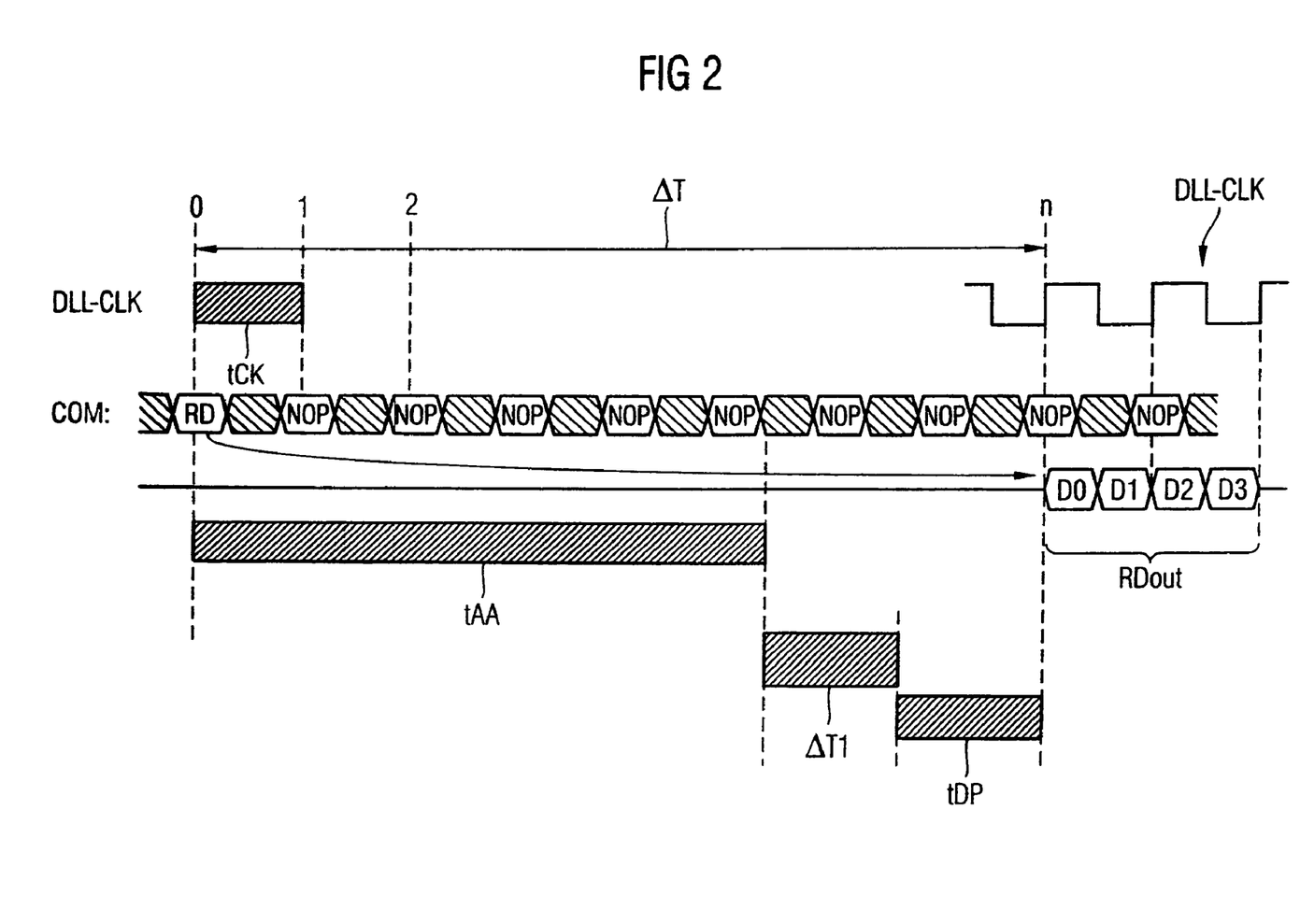
FIG. 2, as discussed above, is a flowchart for a read access for defining the read latency.

FIG. 2 of the drawing shows a schematic signal/time diagram for a read-out process initiated by a read command RD. In the case of a read access, the read data D0-D3 to be read out of the memory cell array 2 are read out of the memory cell array 2 with a known signal delay and pass via the read amplifier 3, the internal data bus 4 and the data buffer FIFO 5 to the inputs of the OCD driver 6. In FIG. 2, tAA designates this signal delay, that is to say the read-out time tAA, which is needed for reading the read data D0-D3 out of the memory cell array 2 and to supply them to the OCD driver 6. The read-out time tAA is typically several clock pulses of the internal clock signal CLK long. The following thus applies:

$$tAA > k*tCK,$$

where tCK is the duration of a single clock pulse of the internal clock signal CLK and k is an integral multiple.

The OCD driver 6 forwards the read data D0-D3 read out and correspondingly forwarded with a further signal delay, also known, to the external data bus 7. tDP here designates the propagation time through the OCD driver 6.

On the basis of the known signal delays tAA, tDP, the so-called read latency ΔT is defined. The read latency designates the period of time ΔT which is needed at a minimum for reading read data D0-D3 out of the memory cell array 2 and providing them at the output of the OCD driver 6, taking into consideration the signal delays tAA, tDP. This read latency ΔT is an integral multiple of one clock pulse of the internal clock signal CLK and thus of the period tCK so that the following applies:

$$\Delta T = n*tCK.$$

However, the data d0-D3 are read out of the memory cell array 2 by using the internal clock signal CLK whereas the data D0-D3 are read out at the output of the OCD driver 6 by using an external clock signal DLL-CLK. This external clock signal DLL-CLK is typically generated via a DLL circuit specially provided for this purpose. The internal clock signal CLK is typically synchronous with the external clock signal DLL-CLK. The read latency ΔT is therefore typically greater by ΔT1 than the sum of the read-out time tAA and the propagation time tDP so that the following applies:

$$\Delta T = n*tCLK > tAA + tDP,$$

and thus $$\Delta T = tAA + tDP + \Delta T1$$

This read latency ΔT is known. The read latency ΔT is typically generated by the read latency generator 8 which shifts the output pointer OUTP correspondingly by n clock pulses of the read latency ΔT with respect to the input pointer INP. These n clock pulses of the read latency ΔT are counted by a read latency counter 8 specially provided for this purpose, which correspondingly shifts the output counter OUTP by a number n of the clock pulses of the clock signal CLK with respect to the input counter INP.

Figure 3:
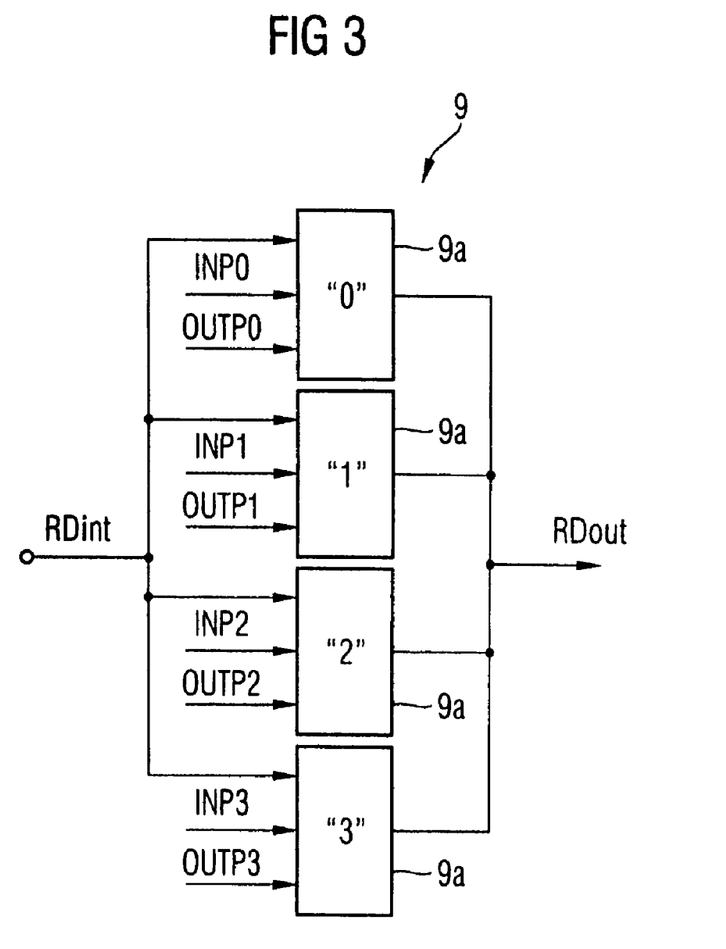
FIG. 3, 3A, as discussed above, are block diagrams for explaining the general problems of the operation of a read latency counter.
Figure 3A:
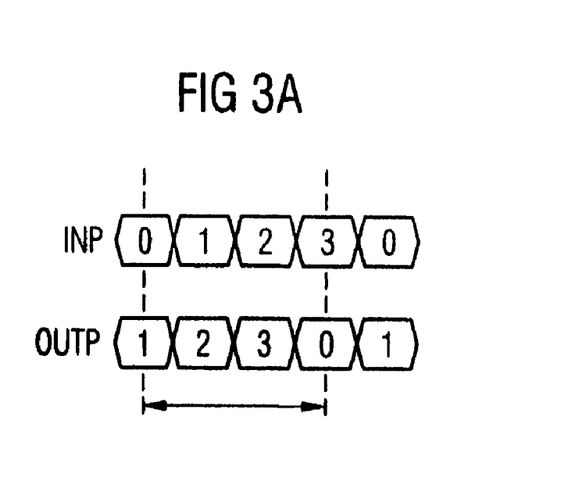

In the implementation of a read latency counter, a FIFO-based concept is mostly used in which the chip-internal read signal RDint is shifted by the programmed read latency ΔT, controlled by the read latency generator 8, and is converted into the domain of the external clock signal DLL-CLK. FIG. 3 of the drawing shows this concept by means of a block diagram. FIG. 3 shows a data buffer FIFO 9 with four individual FIFO cells 9a, that is to say the FIFO depth FT=4. The clock domain is shifted, for example, by the input pointer INP0 opening the cell "0" of the data buffer FIFO so that, following this, the internal data signal RDint is read in. At the same time, for example, the output counter OUTP1 is active. The consequence is that the internal data signal RDint is read out of the cell 0 only three clock pulses later (see FIG. 3A), the premise being that each of the input pointers INP0-INP3 and output pointers OUTP0-OUTP3 is in each case active alternately and in succession for the duration of one clock pulse.

During a read-out process, the number of FIFO cells 9a necessary for reading out data corresponds, for example to the maximum programmable read latency ΔT, depending on implementation. The consequence is that for very high read latencies ΔT, the number of FIFO cells 9a must be correspondingly selected to be very large. As shown in FIG. 3, the outputs of these individual FIFO cells 9a are all short circuited to one another, however, in order to combine the data signal RDint, read out internally, to form a common data signal RDout externally. Thus, each output of a FIFO cell is in each case connected to an external load which, overall, leads to increasingly worse edges, that is to say edges which are becoming flatter, of the data signals read out. An additional aggravating factor is that the respective output lines of the FIFO cells 9a can become very long with a very large FIFO depth which, naturally, can lead to correspondingly undesirably high parasitic capacitances. This, too, has an increasingly negative effect especially with a very large number of FIFO cells 9a.

The higher the operating frequency of the memory chip, the more these problems predominate since the read latency ΔT becomes increasingly larger with reference to the clock signal which is dependent on the frequency, with constant read-out times tAA and propagation times tDP. This leads directly to a greater number of FIFO cells and thus to a greater FIFO depth. The read signal RDout read out at the output has increasingly flatter edges particularly at very high operating frequencies and an associated great FIFO depth. This, in turn, makes it more difficult to synchronize the data signal RDout with the external clock signal DLL-CLK and thus to decode the external data signal RDout in a defined manner.

BRIEF SUMMARY OF THE INVENTION

In one aspect of the invention, a circuit arrangement for time-delaying read data read out of a semiconductor memory with a predetermined read latency, with a common data input at which the read data read out of the semiconductor memory are present, and a data buffer FIFO for buffering the read data read out, which comprises a number of FIFO modules comprising in each case a number of individual FIFO cells, wherein the FIFO modules can be addressed in each case via first input and output pointers allocated to them and the FIFO cells can be in each case addressed via second input and output pointers allocated to them, with a controllable read latency generator which generates the first and second output pointers for driving the FIFO modules and FIFO cells with the read latency predetermined with respect to the first and second input pointers, respectively, with a common data output at which the read data are present time-delayed with the read latency set.

In another aspect of the invention, a semiconductor memory circuit comprises a memory cell array from which read data can be read out during a read access and with a read path in which the following circuit sections are arranged: a read amplifier, a circuit arrangement according to the invention following the output of the read amplifier, an OCD driver following the output of the circuit arrangement, an output interface at which the read data delayed with a predetermined read latency can be picked up.

In a further aspect of the invention, a method for reading out a data buffer FIFO in a circuit arrangement with a two-stage read-out process for reading out the read data stored in the data buffer FIFO comprises the following method steps:
the FIFO cell to be read out is selected by means of a second output pointer which is allocated to a FIFO cell, to be read out, of a FIFO module to be read out, as a result of which the common FIFO module output of the FIFO module to be read out is reloaded with the content of the FIFO cell to be read out;
one clock pulse of an internal clock signal later, the FIFO module to be read out is selected via a first output pointer OUTPA which is allocated to the FIFO module to be read out as a result of which the content of the common FIFO module output is reloaded to the common data output.

The concept forming the basis of the present invention comprises using a data buffer FIFO of modular construction. The data buffer FIFO here generally acts as read latency counter and is clocked by an internal clock signal. In this arrangement, the individual modular FIFO stages of the data buffer FIFO are arranged cascaded with one another. This makes it possible to bypass the problem described initially which results from the short circuit of the outputs and the too long output lines of the data buffer FIFOs and the associated influence of parasitic capacitances.

The modular data buffer FIFO comprises a number of FIFO modules. These FIFO modules are arranged in parallel with one another and act virtually as independent data buffer FIFOs. Each individual FIFO module comprises a number of FIFO cells which can be addressed in each case via an input counter and output counter. The input pointers specify the reference for the output pointers. The output pointers act as data release (signals) of the read data stored in the data buffer FIFO or in its FIFO modules, respectively.

The FIFO arrangement which can be implemented as a result provides in a particularly advantageous manner for a multi stage or at least two stage reading out of the content of the data buffer FIFOs according to the invention. In a first stage, for example, a first FIFO module is read out. In the subsequent second stage, the read data obtained as a result are combined at the common data output.

The data buffer FIFO may be constructed in at least two stages. A first FIFO stage may comprise the FIFO modules and a second FIFO stage may comprise the FIFO cells. Naturally, other grading would also be conceivable, for example a topography of the data buffer FIFO constructed in three or more stages. In this case, naturally, the number of input and output pointers would also have to be adapted correspondingly to the number of stages.

Each FIFO module may comprise an equal number of FIFO cells, for example four FIFO cells. The number of FIFO modules may preferably approximately correspond to the number of FIFO cells of one or in each case all FIFO modules.

Each FIFO module may comprise a common FIFO module input and a common FIFO module output. The plurality of FIFO modules are here arranged in parallel with one another with respect to their FIFO module inputs and FIFO module outputs. The FIFO modules are activated with the input and output pointers in such a manner that the FIFO modules are activated successively which makes it possible to operate the FIFO modules in a cascaded manner.

To amplify the read data read out of the output of a FIFO module, it may preferably in each case be followed by a driver circuit allocated to this FIFO module via which the common FIFO module outputs are combined to form the common data output. This driver circuit can be constructed, for example, as Tristate driver or also as conventional output driver, e.g. as OPV.

A mode register may be provided in which at least a predetermined read latency for driving the read latency generator is stored or can be stored. In the case of a number of stored read latencies, the data buffer FIFO can be operated in a number of operating modes.

The data buffer FIFO and/or each FIFO module and/or each FIFO cell may be clocked with a clock pulse of an internal clock signal with which the read data are also read out.

A respective FIFO cell and/or a respective FIFO module can be operated both in a write mode and in a read mode. In the write mode, the FIFO cell can be addressed via a specific second input counter allocated to this FIFO cell so that a read data item can be stored in this FIFO cell. In the read mode, the FIFO cell can be selected via a specific second output counter allocated to this FIFO cell so that the stored read data item can here be read out of this FIFO cell.

The inventive circuit arrangement may be constructed in such a manner that a maximum of only one FIFO cell can be operated in write mode and a maximum of only one other FIFO cell can be operated in read mode during one clock pulse of an internal clock signal.

The inventive semiconductor memory circuit may provide a first clock generator which generates an internal clock signal for reading the read data out of the memory cell array, for the read amplifier and/or for the data buffer FIFO of the circuit arrangement. Furthermore, a second clock generator can be provided which provides an external clock signal, which is typically asynchronous with respect to the internal clock signal, for the time-delayed reading-out of the read data via the OCD driver and the output interface. In a very appropriate embodiment, the second clock generator is constructed as DLL circuit which derives the second clock signal from the first clock signal.

In the case of so-called DDR (double data rate) semiconductor memories, in particular, and particularly in the case of memories for graphics applications, the present invention is suitable for meeting the demand for ever higher data processing speed, mentioned initially. In such DDR DRAM memories, data are read out and written back into the memory, respectively, both with the rising edge and with the falling edge of an internal clock signal so that this type of semiconductor memory is distinguished by a comparatively doubled data rate. Such memories, therefore, are mainly suitable for graphics applications. In graphics applications, a particularly high demand is made of the performance of the memory due to the multiplicity of data to be processed.

BRIEF DESCRIPTION OF THE SEVERAL VIEWS OF THE DRAWINGS

In the text which follows, the invention will be explained in greater detail with reference to the exemplary embodiments specified in the diagrammatic figures of the drawing, in which.

DETAILED DESCRIPTION OF THE INVENTION

In the figures of the drawing, identical or functionally identical elements and signals have been provided with the same reference symbols unless otherwise specified.

Figure 4:
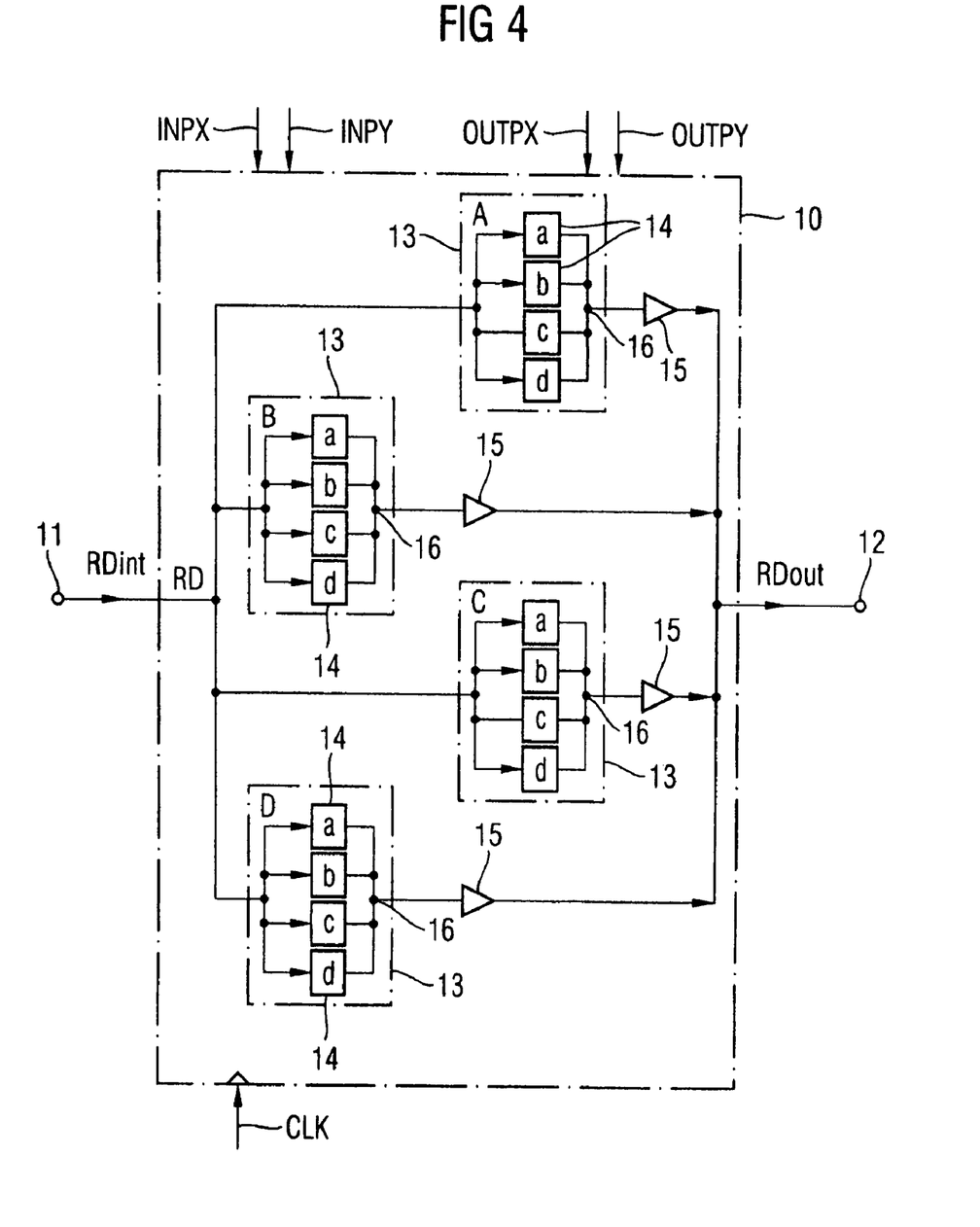
FIG. 4 is a block diagram of a circuit arrangement according to the invention, comprising a read latency counter.

FIG. 4 shows a block diagram of a circuit arrangement according to the invention with a read latency counter. The circuit arrangement according to the invention contains a data buffer FIFO 10 as read latency counter. The data buffer FIFO 10 has a common data input 11 and a common data output 12. Via the data input 11, an internal read signal RDint is coupled into the data buffer FIFO 10 which can be picked up at the common data output 12 as delayed external read signal RDout correspondingly time-delayed with the read latency set in each case.

According to the invention, the data buffer FIFO 10 is of modular structure and, in the present exemplary embodiment, has a total of four FIFO modules 13 which are here identified by A-D so that they are mutually distinguishable. The four FIFO modules 13 are arranged between the common data input 11 and the common data output 12 and are also arranged in parallel with one another with respect to their inputs and outputs. Each of the FIFO modules 13 has four individual FIFO cells 14, the respective FIFO cells 14 being identified by a-d to be mutually distinguishable within a respective FIFO module 13. These FIFO cells 14 are arranged in parallel with one another in a familiar manner and are thus connected to the data input 11 at the input end and to the data output 12 at the output end. Between a respective output of a FIFO module 13 and the common data output 12, an amplifier circuit 15 is in each case arranged, for example a Tristate driver 15.

In distinction from the known data buffer FIFOs 10, the data buffer FIFO 10 according to the invention has two input pointers INPX, INPY and two output pointers OUTPX, OUTPY, where X=[A-D] and Y=[a-d]. One of these input and output pointers INPX, OUTPX in each case is used for selecting and activating a respective FIFO module 13 whereas the other input and output pointer INPY, OUTPY in each case is used for selecting and activating the respective FIFO cell 14 within this FIFO module 13. In the case of selection and activation of a FIFO cell and of a FIFO module, respectively, data can be stored in it and read out of it again, respectively.

In the present exemplary embodiment, the data buffer FIFO 10 according to the invention thus has a total of 16 FIFO cells 14 which are distributed to four FIFO modules 13 having four FIFO cells 14 each. In this manner, a total of two types of output nodes 16, 12 are obtained. The four first output nodes 16 are located at the output of a respective FIFO module 13 and are designed for connecting the four individual FIFO cells 14 of a respective FIFO module 13 with one another. The second output node 12 forms the common output 12 of the data buffer FIFO 10, as it were, and thus connects the four individual FIFO modules 14 to one another.

Figure 5:
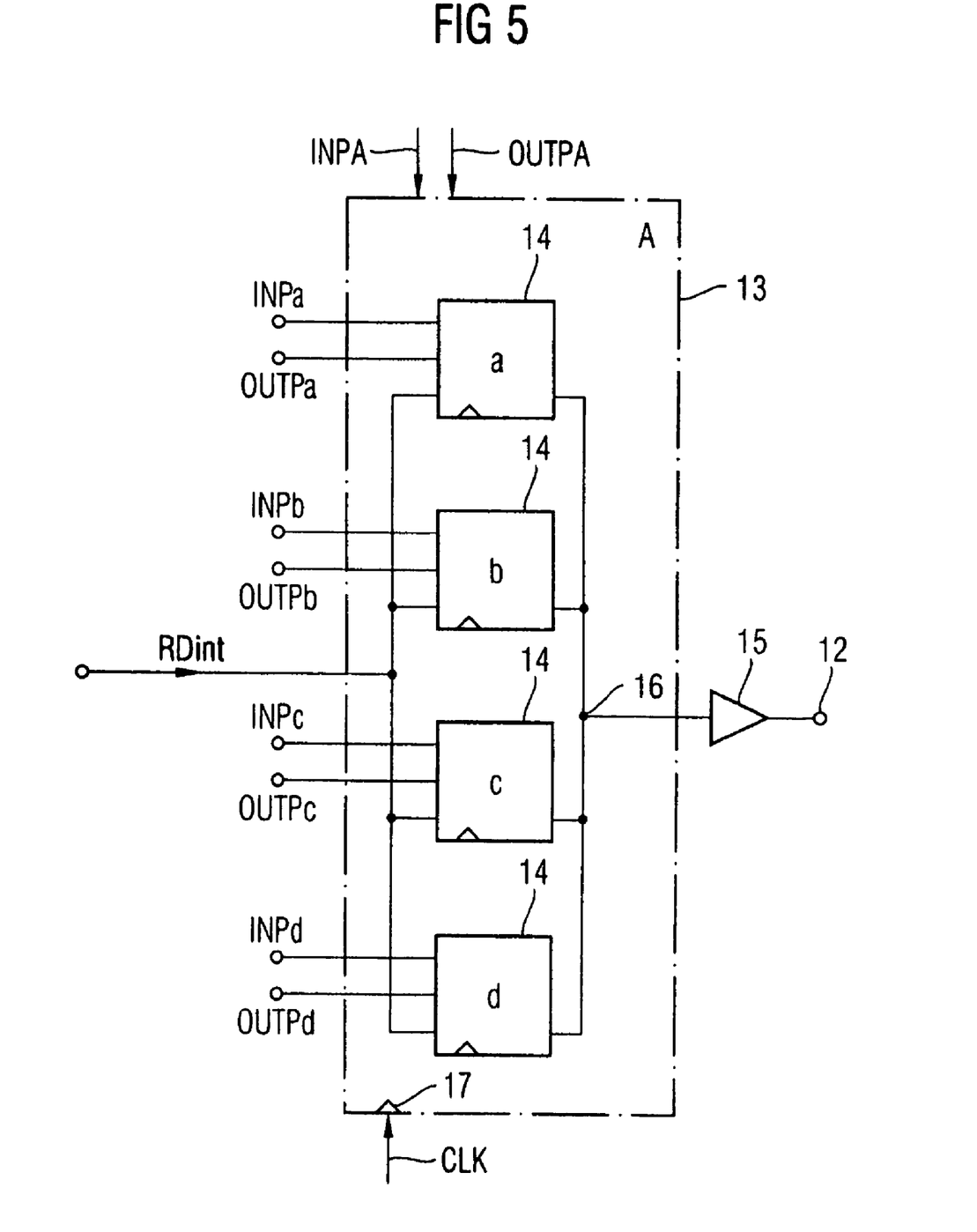
FIG. 5 is a block diagram of an individual FIFO module of the read latency counter according to the invention from FIG. 4 in detail.

FIG. 5 shows the operation of an individual FIFO module 13—of the FIFO module 13 designated by A in the present exemplary embodiment—in detail. This FIFO module 13 is selected via the input pointer INPA and the output pointer OUTPA. To select the respective FIFO cells 14 within this FIFO module 13, a separate input pointer INPa-INPd is additionally allocated to each FIFO cell 14 for reading in the respective read data RDint. Furthermore, a separate output pointer OUTPa-OUTPd is also allocated to each of these FIFO cells 14.

In the text which follows, the operation of the data buffer FIFO 10 according to the invention constructed as latency counter and, in particular, of an individual FIFO module 13, is explained briefly:

Internal read data RDint which are allocated to a read command RD (see FIG. 2) are read into a FIFO cell 14 of a FIFO module 13 in the following manner: firstly, the corresponding FIFO module 13 is selected by means of the input pointer INPa. Each FIFO cell 14 of this FIFO module 13 is in each case connected to a different input counter INPa-INPd so that in each case one of the FIFO cells 14 allocated to the input pointer INPa-INPd is successively opened.

This FIFO module 13 is read out in two stages: firstly, one of the FIFO cells 14 of the FIFO module 13 selected in each case is opened as a result of which the common node 16 at the output of this FIFO module 13 is reloaded. One clock pulse of the internal clock signal CLK later, this FIFO module 13 is selected via the output pointer OUTPA. The output signal of this FIFO module 13 is supplied to the common output 12 via the output driver 15. The common node 16 at the output of the selected FIFO module 13 is reloaded to the common output 12. Reading-out thus takes place in two synchronous and successive method steps, each step being separately characterized by a lower load overall and thus being able to be performed very much more quickly in comparison with an only single-stage embodiment of the data buffer FIFOs as in FIG. 3). This significantly reduces the output load of the data buffer FIFO 10. The data buffer FIFO 10 according to the invention is thus suitable for operation at very high operating frequencies.

Figure 6:
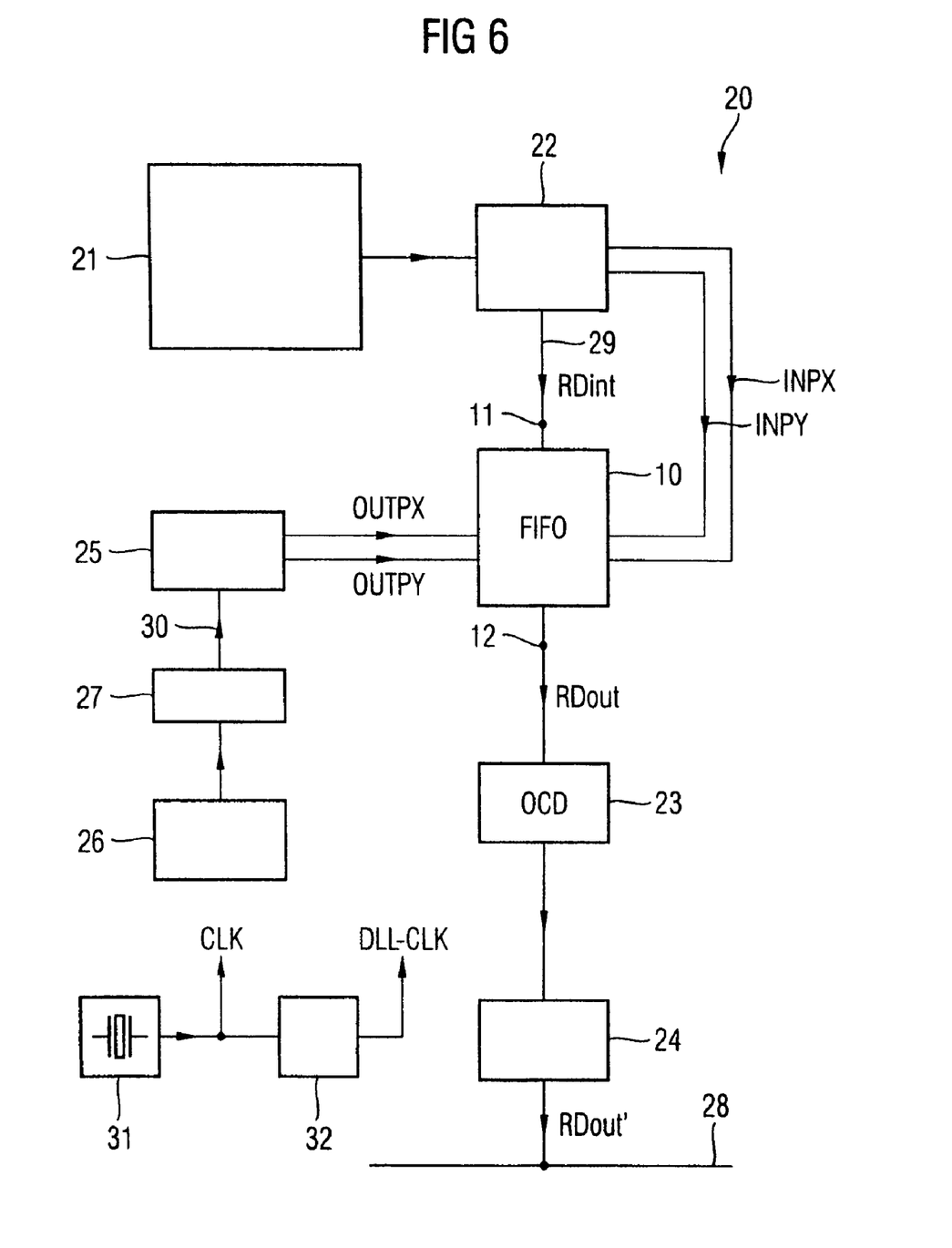
FIG. 6 is a block diagram with a section of a S-DRAM semiconductor memory according to the invention in the area of its read path.

FIG. 6 shows a block diagram of a section of a semiconductor memory in the area of its read path. The semiconductor memory according to the invention is here designated by the reference symbol 20. The semiconductor memory 20 can be, e.g. a DDR-DRAM memory or a conventional S-DRAM memory. The semiconductor memory 20 contains a memory cell array 21 into which data can be written and can also be read out again. On the read path of the semiconductor memory 20, a read amplifier 22, an internal data bus, an OCD driver 23 and an output interface 24 and an external data bus 28 are arranged. The data buffer FIFO 10 is arranged between the read amplifier 22 which is used for reading read data out of the memory cell array 21 and the OCD driver 23. The read amplifier 22 is designed for generating in each case two input pointers INPX, INPY which is supplied to the data buffer FIFO 10.

Furthermore, a read latency generator 25 is provided which adjusts the different latencies with the different output pointers OUTPX, OUTPY for driving the data buffer FIFO 10. FIG. 6 also shows a so-called mode register 26 in which the predetermined read latencies (for example for operating modes of the semiconductor memory 20) are stored. A read latency stored in the mode register 26 can be decoded in a decoder 27 specially provided for this purpose and supplied as CAS latency 30 to the read latency generator 25 which generates the two output pointers OUTPX, OUTPY with the read latency desired in each case with respect to the respective input pointers INPX, INPY.

FIG. 6 also shows a first clock generator 31 which generates the internal clock signal CLK which is used in a second clock generator 32 for generating the external clock signal DLL-CLK.

Although the present invention has been explained in greater detail above with reference to preferred exemplary embodiments, it should not be restricted to this but can be modified in many ways. In particular, the data buffer FIFO according to the invention and the read latency generator for generating the output pointers have been represented deliberately with very simple circuits. Naturally, these circuit sections can also be constructed in a modified manner without deviating from the basic essence of the present invention.

Naturally, the numbers specified, that is to say the use of four FIFO modules and in each case four FIFO cells within a FIFO module also have been selected only by way of example in order to create a FIFO depth of 16 in the present exemplary embodiment. Such a FIFO depth of 16 can also be implemented by dividing the FIFO modules and FIFO cells differently. In addition, it is also conceivable to implement a lesser or greater FIFO depth by dividing the FIFO modules and FIFO cells differently. In particular, the data buffer FIFO can also be constructed in a modular manner in a different way, for example by using a greater or also a lesser number of FIFO modules or by varying the number of FIFO cells within a FIFO module. In a minimal variant, it would also be sufficient if only two FIFO modules and/or only two FIFO cells within a FIFO module are provided. In particular, it should be pointed out that not necessarily each of the FIFO modules must in each case have an identical number of FIFO cells but that these can also be different in the different FIFO modules. In addition, a two-stage architecture of a data buffer FIFO according to the invention was described in the present exemplary embodiment. Naturally, a more than two-stage structure of the data buffer FIFO is also conceivable for example in each case by combining in each case a number of FIFO modules to form a higher-level FIFO module and thus implementing a three-or multi-stage FIFO structure.

What is claimed is:

1. A circuit arrangement for reading out data time delayed from a semiconductor memory, comprising:
   a common data input at which read data, which are read out of a semiconductor memory, are present,
   a data buffer FIFO for buffering said read data which have been read out; said buffer FIFO comprising a plurality of FIFO modules each comprising a plurality of individual FIFO cells; each of said FIFO modules addressed via respective allocated first input and output pointers and each of said FIFO cells addressed via respective allocated second input and output pointers;
   a controllable read latency generator generating said first and second output pointers for driving the FIFO modules and FIFO cells with a read latency predetermined with reference to said first and second input pointers, respectively; and
   a common data output at which said read data are present time delayed in dependence on said predetermined read latency.

2. The circuit arrangement of claim 1, wherein said data buffer FIFO comprises at least first and second FIFO stages; said first FIFO stage comprising said FIFO modules and said second FIFO stage comprising said FIFO cells.

3. The circuit arrangement of claim 1, wherein each of said FIFO module comprises an equal number of FIFO cells or wherein each of said FIFO module comprises four FIFO cells.

4. The circuit arrangement of claim 1, wherein each of said FIFO module comprises a common FIFO module input and a common FIFO module output and wherein said plurality of FIFO modules are arranged in parallel with respect to said common FIFO module inputs and outputs.

5. The circuit arrangement of claim 4, comprising a plurality of driver circuits, wherein each of said FIFO modules is followed by one of said plurality of driver circuits, by which said common FIFO module outputs are combined to form said common data output.

6. The circuit arrangement of claim 5, wherein said plurality of driver circuits is a plurality of tristate driver circuits.

7. The circuit arrangement of claim 1, comprising a mode register in which at least one read latency for driving said read latency generator is stored.

8. The circuit arrangement of claim 1, wherein at least one of said data buffer FIFO, each of said FIFO module, or each of said FIFO cells is clocked with a clock pulse of an internal clock signal by means of which said read data are also read out.

9. The circuit arrangement of claim 1, wherein at least one of said FIFO cells or said FIFO modules can be operated in a write mode and in a read mode; said FIFO cell being configured to be addressed in said write mode via a specific second input counter allocated to said FIFO cell and to store a read data item, and said FIFO cell being configured to be selected in said read mode via a specific second output counter allocated to said FIFO cell such that said read data item can be read out of said FIFO cell.

10. The circuit arrangement of claim 1, wherein at most one of said FIFO cells can be operated in a write mode and another of said FIFO cells can be operated in a read mode during one clock cycle of an internal clock signal.

11. A semiconductor memory circuit comprising:
    a memory cell array, from which read data can be read out during a read access; and a read path in which the following circuit sections are arranged:
  a read amplifier;
  a circuit arrangement according to claim 1 following an output of said read amplifier;
  an OCD driver following an output of said circuit arrangement; and
  an output interface at which said read data delayed with said read latency can be picked up.

12. The semiconductor memory circuit of claim 11, further comprising:
  a first clock generator generating an internal clock signal for reading out said read data from said memory cell array, said internal clock signal being meant for at least one of said read amplifier or said data buffer FIFO;
  a second clock generator providing an external clock signal for reading out time delayed with said read latency said read data via said OCD driver and said output interface; said external clock signal being asynchronous with respect to said internal clock signal.

13. The semiconductor memory circuit of claim 12, wherein said second clock generator is a DLL circuit generating said external clock signal dependent from said internal clock signal.

14. The semiconductor memory circuit of claim 10, wherein said semiconductor memory is a DDR DRAM memory.

15. The semiconductor memory circuit of claim 14, wherein said DDR DRAM memory is meant for graphics applications.

16. A method for reading out a data buffer FIFO of a circuit arrangement according to claim 1; said method comprising the steps of:
  selecting, to be read out by means of a relevant of said second output pointers, a specific FIFO cell of said plurality of FIFO cells of a specific FIFO module of said plurality of FIFO modules, said relevant second output pointer being allocated to said specific FIFO cell;
  in response to selecting said specific FIFO cell, reloading said common FIFO module output of said specific FIFO module with the content of said specific FIFO cell;
  selecting, one clock pulse of an internal clock signal later, said specific FIFO module via a relevant of said first output pointers; said relevant first output pointer being allocated to said specific FIFO module; and
  in response to selecting said specific FIFO module, reloading the content of said common FIFO module output to said common data output.

\* \* \* \* \*